US012555754B2

(12) United States Patent
Ko

(10) Patent No.: US 12,555,754 B2
(45) Date of Patent: Feb. 17, 2026

(54) FOCUS RING, SUBSTRATE PROCESSING APPARATUS INCLUDING THE SAME, AND SUBSTRATE PROCESSING METHOD USING THE SAME

(71) Applicant: SAMSUNG ELECTRONICS CO., LTD., Suwon-si (KR)

(72) Inventor: Hyungsik Ko, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 37 days.

(21) Appl. No.: 18/768,859

(22) Filed: Jul. 10, 2024

(65) Prior Publication Data

US 2025/0232960 A1 Jul. 17, 2025

(30) Foreign Application Priority Data

Jan. 16, 2024 (KR) ........................ 10-2024-0006828

(51) Int. Cl.
*H01J 37/32* (2006.01)

(52) U.S. Cl.
CPC .... *H01J 37/32642* (2013.01); *H01J 37/3244* (2013.01); *H01J 37/32697* (2013.01); *H01J 37/32715* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 8,755,680 B2 | 6/2014 | Koelmel et al. | |
| 9,975,779 B2 | 5/2018 | Sugihara et al. | |
| 10,497,597 B2 | 12/2019 | Lee et al. | |
| 10,847,347 B2 | 11/2020 | Noorbakhsh et al. | |
| 11,393,710 B2 | 7/2022 | Rice et al. | |

(Continued)

FOREIGN PATENT DOCUMENTS

| | | |
|---|---|---|
| JP | 2018-17433 A | 7/2018 |
| JP | 7001165 B2 | 1/2022 |

(Continued)

OTHER PUBLICATIONS

Extended European Search Report dated May 22, 2025, issued by the European Patent Office in European Application No. 24221460.9.

*Primary Examiner* — Wilson Lee
(74) *Attorney, Agent, or Firm* — Sughrue Mion, PLLC

(57) ABSTRACT

Focus rings, substrate processing apparatuses, and substrate processing methods are provided. A focus ring includes a ring body having an axis that extends in a first direction. The ring body includes a top surface, an inner lateral surface that downwardly extends from the top surface, and a bottom surface that outwardly extends from a lower end of the inner lateral surface. The inner lateral surface includes a first inner lateral surface that downwardly extends from the top surface, and a second inner lateral surface that downwardly extends from a lower end of the first inner lateral surface. The second inner lateral surface forms a first acute angle with the first direction. The bottom surface includes a flat surface, and an inclined surface that extends from the flat surface toward the second inner lateral surface. The inclined surface forms a second acute angle with the first direction.

20 Claims, 14 Drawing Sheets

(56) References Cited

U.S. PATENT DOCUMENTS

| | | | | |
|---|---|---|---|---|
| 11,471,987 | B2 | 10/2022 | Maeda et al. | |
| 11,728,144 | B2 | 8/2023 | Matsuyama | |
| 2014/0034242 | A1 | 2/2014 | Sant et al. | |
| 2016/0181142 | A1 | 6/2016 | Raj et al. | |
| 2018/0182635 | A1 | 6/2018 | Tsukahara et al. | |
| 2020/0321193 | A1* | 10/2020 | Ni | H01L 21/67069 |
| 2021/0027997 | A1* | 1/2021 | Kim | H01J 37/32834 |
| 2022/0199368 | A1* | 6/2022 | Son | H01J 37/32715 |
| 2023/0099398 | A1 | 3/2023 | Oka | |
| 2023/0317426 | A1* | 10/2023 | Bang | H01J 37/32642 156/345.51 |
| 2023/0369026 | A1* | 11/2023 | Kimball | H01J 37/32651 |
| 2023/0369029 | A1* | 11/2023 | Son | H01J 37/32697 |
| 2023/0369030 | A1* | 11/2023 | Zhu | H01J 37/32633 |
| 2024/0021417 | A1* | 1/2024 | Ko | H01L 21/68785 |
| 2025/0140529 | A1* | 5/2025 | Fischer | H01J 37/32449 |
| 2025/0239438 | A1* | 7/2025 | Peng | H01L 22/12 |
| 2025/0273441 | A1* | 8/2025 | Mui | H01L 21/67115 |

FOREIGN PATENT DOCUMENTS

| | | | |
|---|---|---|---|
| KR | 10-2004-0019196 | A | 3/2004 |
| KR | 10-2162429 | B1 | 10/2020 |
| KR | 10-2023-0007643 | A | 1/2023 |

* cited by examiner

FOCUS RING, SUBSTRATE PROCESSING APPARATUS INCLUDING THE SAME, AND SUBSTRATE PROCESSING METHOD USING THE SAME

CROSS-REFERENCE TO RELATED APPLICATION

This U.S. non-provisional application claims priority under 35 U.S.C § 119 to Korean Patent Application No. 10-2024-0006828, filed on Jan. 16, 2024, in the Korean Intellectual Property Office, the disclosure of which is hereby incorporated by reference in its entirety.

BACKGROUND

1. Technical Field

Embodiments of the present disclosure relate to a focus ring, a substrate processing apparatus including the same, and a substrate processing method using the same, and more particularly, to a focus ring capable of controlling discharge of gas transfer gas, a substrate processing apparatus including the same, and a substrate processing method using the same.

2. Brief Description of Background Art

A semiconductor device may be fabricated by using various processes. For example, a semiconductor device may be manufactured by allowing a silicon wafer to undergo a photolithography process, an etching process, a deposition process, and so forth. Various fluids may be used in such processes. For example, plasma may be used in an etching process and/or a deposition process. A focus ring may be used to control the plasma. To control a temperature of the focus ring, a heat transfer gas may be supplied toward a bottom surface of the focus ring.

SUMMARY

Some embodiments of the present disclosure provide a focus ring enabling uniform discharge of heat transfer gas, a substrate processing apparatus including the same, and a substrate processing method using the same.

Some embodiments of the present disclosure provide a focus ring capable of increasing a yield of a substrate etching process, a substrate processing apparatus including the same, and a substrate processing method using the same.

Some embodiments of the present disclosure provide a focus ring capable of being installed accurately and promptly, a substrate processing apparatus including the same, and a substrate processing method using the same.

Aspects of embodiments of the present disclosure are not limited to the aspects mentioned above, and other aspects which have not been mentioned above will be clearly understood to those skilled in the art from the following description.

According to embodiments of the present disclosure, a substrate processing apparatus is provided and includes a focus ring including a ring body having an axis that extends in a first direction. The ring body includes: a top surface; an inner lateral surface that downwardly extends from the top surface; and a bottom surface that outwardly extends from a lower end of the inner lateral surface. The inner lateral surface includes: a first inner lateral surface that downwardly extends from the top surface, the first inner lateral surface being parallel to the first direction; and a second inner lateral surface that downwardly extends from a lower end of the first inner lateral surface, the second inner lateral surface making a first acute angle with the first direction. The bottom surface includes: a flat surface perpendicular to the first direction; and an inclined surface that extends from the flat surface toward the second inner lateral surface, the inclined surface making a second acute angle with the first direction.

According to embodiments of the present disclosure, a substrate processing apparatus is provided and includes: a process chamber that includes a process space; a stage in the process chamber; and a focus ring on the stage. The stage includes: a chuck body; and a chuck electrode in the chuck body. The chuck body includes a gas supply channel that is downwardly recessed from a top surface of the chuck body. The gas supply channel includes an outer channel beneath the focus ring. The focus ring includes a ring body. The ring body includes: a top surface; an inner lateral surface that downwardly extends from the top surface of the ring body; and a bottom surface that outwardly extends from a lower end of the inner lateral surface. The bottom surface includes: a flat surface parallel to a horizontal direction of the focus ring; and an inclined surface that extends from the flat surface toward the inner lateral surface and forms a first acute angle with the flat surface.

According to embodiments of the present disclosure, a substrate processing method is provided and includes: placing a focus ring on a stage of a substrate processing apparatus; supplying a gas through the stage to a location beneath the focus ring; placing a substrate on the stage; and supplying a process gas into the substrate processing apparatus. The focus ring includes a ring body. The ring body includes: a top surface; an inner lateral surface that downwardly extends from the top surface; and a bottom surface that outwardly extends from a lower end of the inner lateral surface. The bottom surface includes: a flat surface parallel to a horizontal direction of the ring body; and an inclined surface that extends from the flat surface toward the inner lateral surface and forms an acute angle with the flat surface. The supplying the gas to the location beneath the focus ring includes supplying the gas from a location beneath the inclined surface toward the inclined surface.

Details of other example embodiments are included in the following description and drawings.

DETAILED DESCRIPTION

Figure 1:
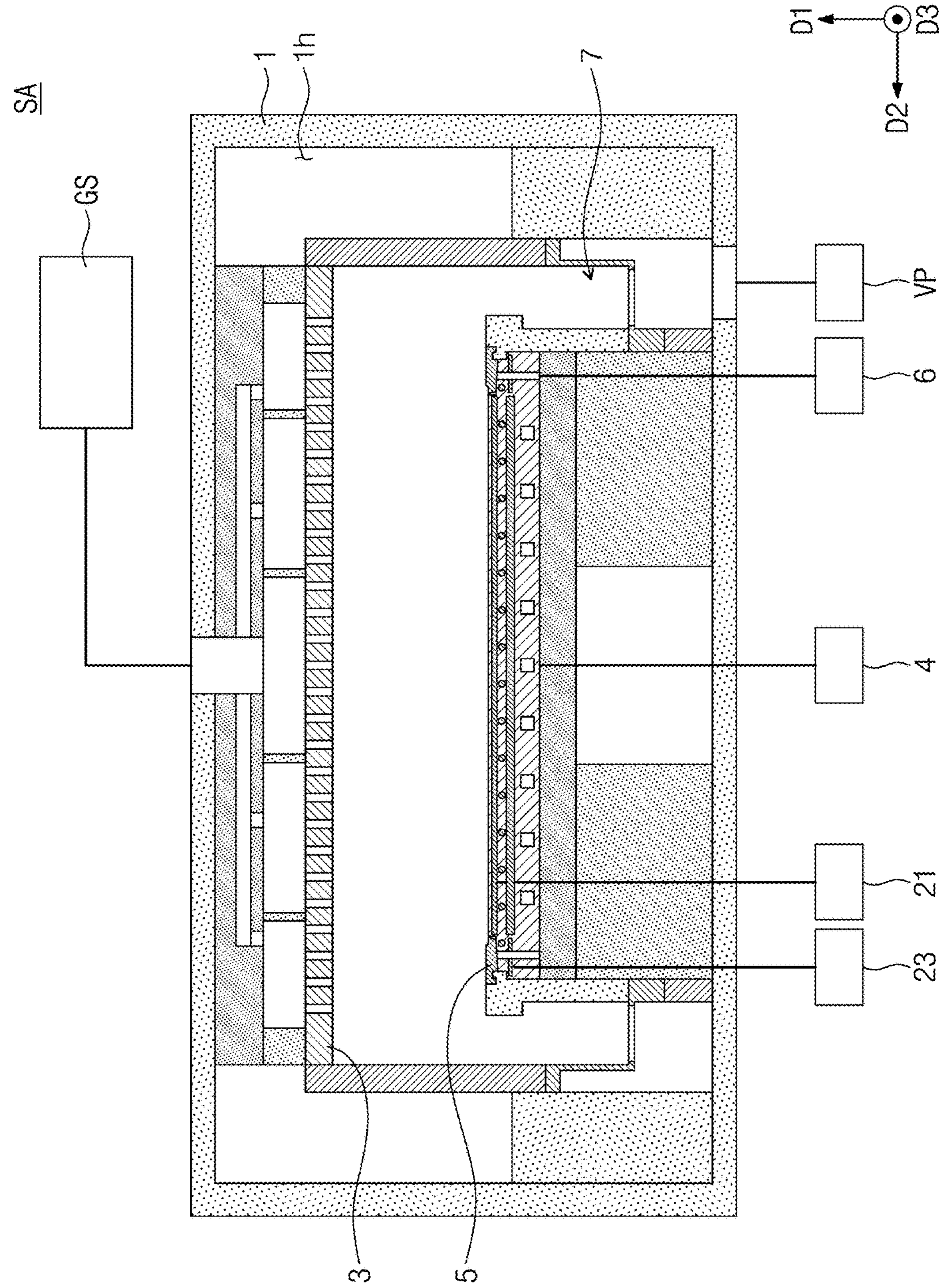
FIG. 1 illustrates a cross-sectional view showing a substrate processing apparatus according to some embodiments of the present disclosure.

The following will now describe some non-limiting example embodiments of the present disclosure with reference to the accompanying drawings. Like reference numerals may indicate like components throughout the description.

It will be understood that when an element or layer is referred to as being "on," "connected to," or "coupled to" another element or layer, it can be directly on, connected to, or coupled to the other element or layer or intervening elements or layers may be present. In contrast, when an element or layer is referred to as being "directly on," "directly connected to," or "directly coupled to" another element or layer, there are no intervening elements or layers present.

FIG. 1 illustrates a cross-sectional view showing a substrate processing apparatus according to some embodiments of the present disclosure.

In this description, a first direction D1, a second direction D1 that intersects the first direction D1, and a third direction D3 that intersects each of the first direction D1 and the second direction D2 are described. The first direction D1 may be called a vertical direction or an upward direction. Each of the second direction D2 and the third direction D3 may be called a horizontal direction.

Referring to FIG. 1, a substrate processing apparatus SA may be provided. The substrate processing apparatus SA may perform an etching process and/or a deposition process on a substrate. A term "substrate" used in this description may mean a silicon (Si) wafer, but embodiments of the present disclosure are not limited thereto. The substrate processing apparatus SA may use plasma to process a substrate. The substrate processing apparatus SA may generate plasma in various ways. For example, the substrate processing apparatus SA may be a capacitively coupled plasma (CCP) apparatus and/or an inductively coupled plasma (ICP) apparatus. For convenience, the following will illustrate and discuss a CCP type substrate processing apparatus. The substrate processing apparatus SA may include a process chamber 1, a stage 7, a focus ring 5, an outer ring 9 (see FIGS. 3-4), a showerhead 3, a first chucking power apply device 21, a second chucking power apply device 23, a radio-frequency (RF) power apply device 4, a heat transfer gas supply device 6, a vacuum pump VP, and a gas supply device GS.

The process chamber 1 may provide a process space 1*h*. A substrate process may be performed in the process space 1*h*. The process space 1*h* may be isolated from an external space. During a substrate process, the process space 1*h* may be in a substantial vacuum state. The process chamber 1 may have a cylindrical shape, but embodiments of the present disclosure are not limited thereto.

The stage 7 may be positioned in the process chamber 1. For example, the stage 7 may be positioned in the process space 1*h*. The stage 7 may support and/or fix a substrate. A substrate process may be performed in a state where a substrate is placed on the stage 7. The stage 7 will be further discussed in detail below.

The focus ring 5 may be positioned on the stage 7. For example, the focus ring 5 may be supported by the stage 7. The focus ring 5 will be further discussed in detail below.

The outer ring 9 (see FIGS. 3-4) may be positioned on the stage 7. The outer ring 9 may surround the focus ring 5. The outer ring 9 will be further discussed in detail below.

The showerhead 3 may be positioned in the process chamber 1. For example, the showerhead 3 may be positioned in the process space 1*h*. The showerhead 3 may be disposed upwardly spaced apart from the stage 7. A gas supplied from the gas supply device GS may be uniformly sprayed through the showerhead 3 into the process space 1*h*.

The first chucking power apply device 21 may apply a direct-current (DC) power to the stage 7. The DC power applied from the first chucking power apply device 21 may rigidly place a substrate on a certain position on the stage 7. A detailed description thereof will be further provided below.

The second chucking power apply device 23 may apply a direct-current (DC) power to the stage 7. The DC power applied from the second chucking power apply device 23 may rigidly place a substrate on a certain position on the stage 7. A detailed description thereof will be further provided below.

The RF power apply device 4 may supply a radio-frequency (RF) power to the stage 7. It may thus be possible to control plasma in the process space 1*h*. A detailed description thereof will be further provided below.

The heat transfer gas supply device 6 may supply a gas to a top surface of the stage 7. The heat transfer gas supply device 6 may be connected to the stage 7. The heat transfer gas supply device 6 may supply a gas through the stage 7 to the top surface of the stage 7. For example, the heat transfer gas supply device 6 may supply a gas to a bottom surface of a substrate disposed on the top surface of the stage 7. In addition, the heat transfer gas supply device 6 may supply a gas to a bottom surface of the focus ring 5 supported on the top surface of the stage 7. The heat transfer gas supply device 6 may include a gas tank, a compressor, and a valve. A gas supplied from the heat transfer gas supply device 6 may include helium (He), but embodiments of the present disclosure are not limited thereto. A detailed description thereof will be further provided below.

The vacuum pump VP may be connected to the process space 1*h*. The vacuum pump VP may apply a vacuum pressure to the process space 1*h* while a substrate process is performed.

The gas supply device GS may supply a process gas to the process space 1*h*. The gas supply device GS may include a gas tank, a compressor, and a valve. The plasma may be generated from a portion of gas supplied from the gas supply device GS to the process space 1*h*.

Figure 2:
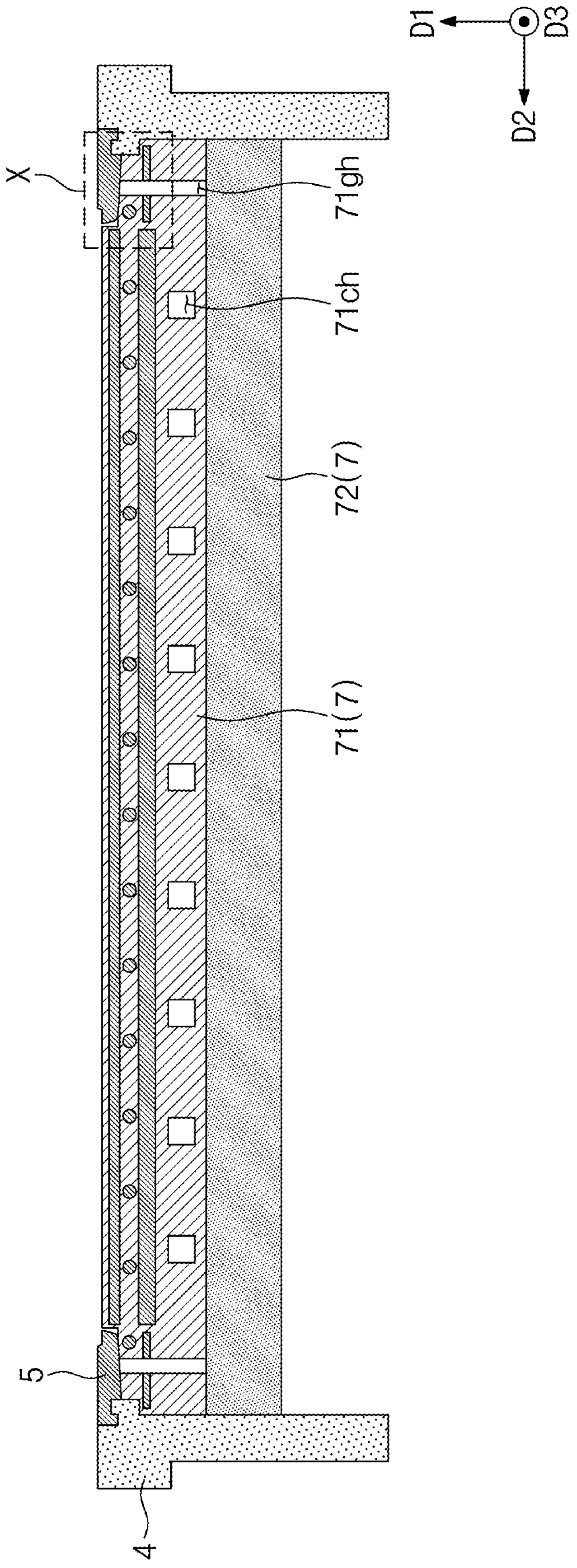
FIG. 2 illustrates a cross-sectional view showing a stage and a focus ring according to some embodiments of the present disclosure.
Figure 3:
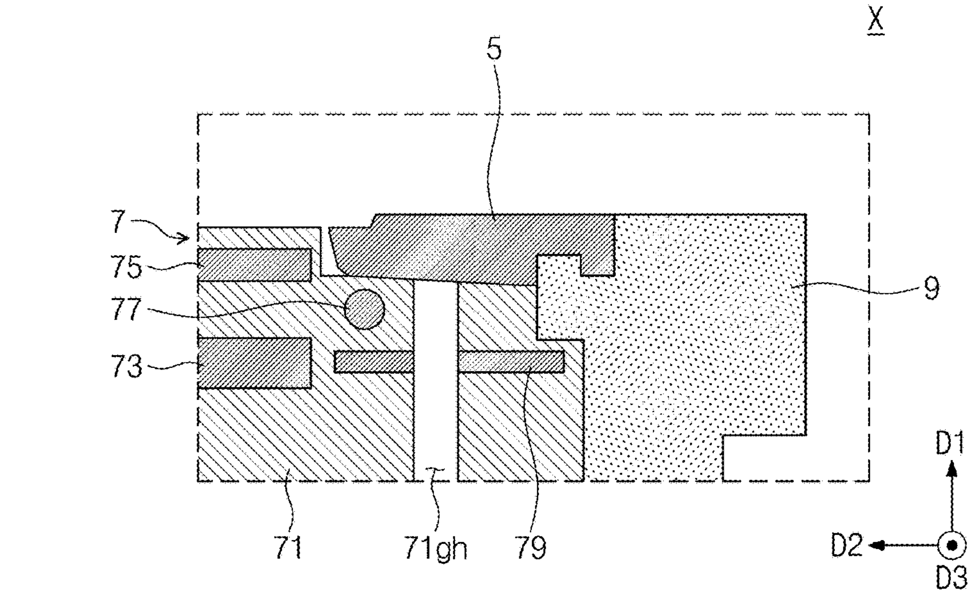
FIG. 3 illustrates an enlarged cross-sectional view showing section X of FIG. 2.
Figure 4:
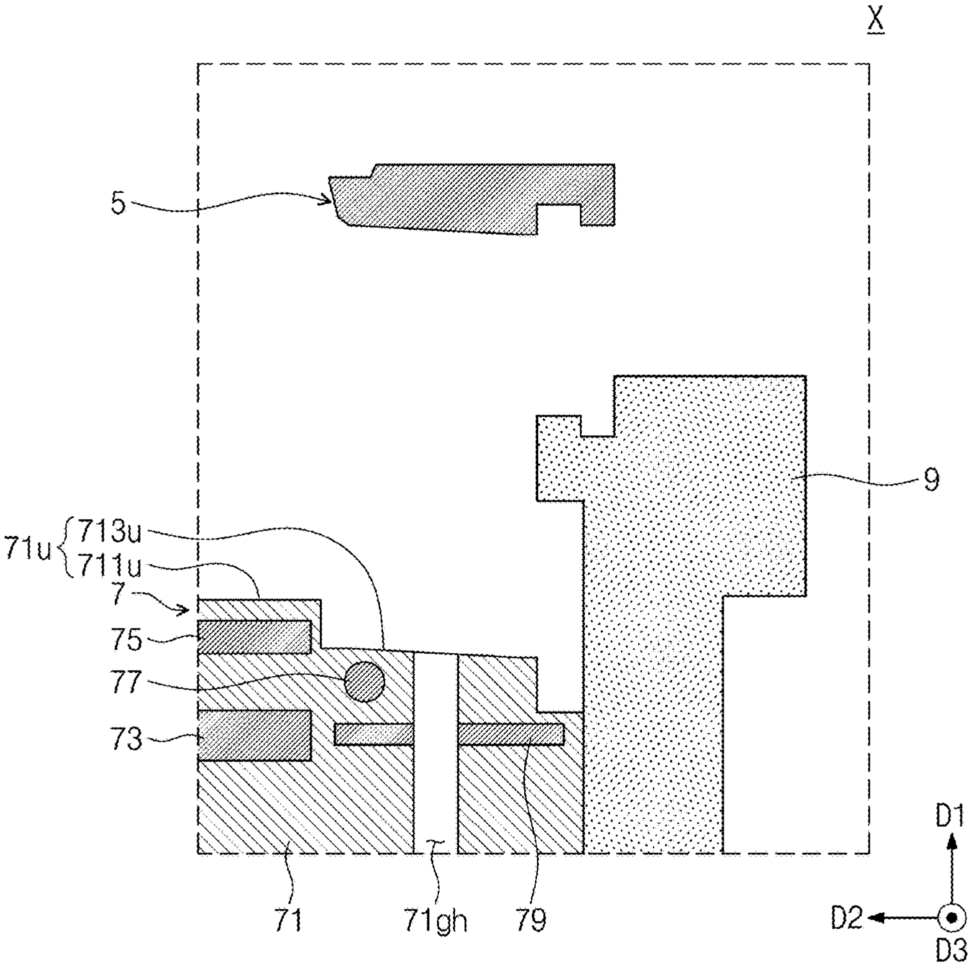
FIG. 4 illustrates an exploded perspective view of FIG. 3.
Figure 5:
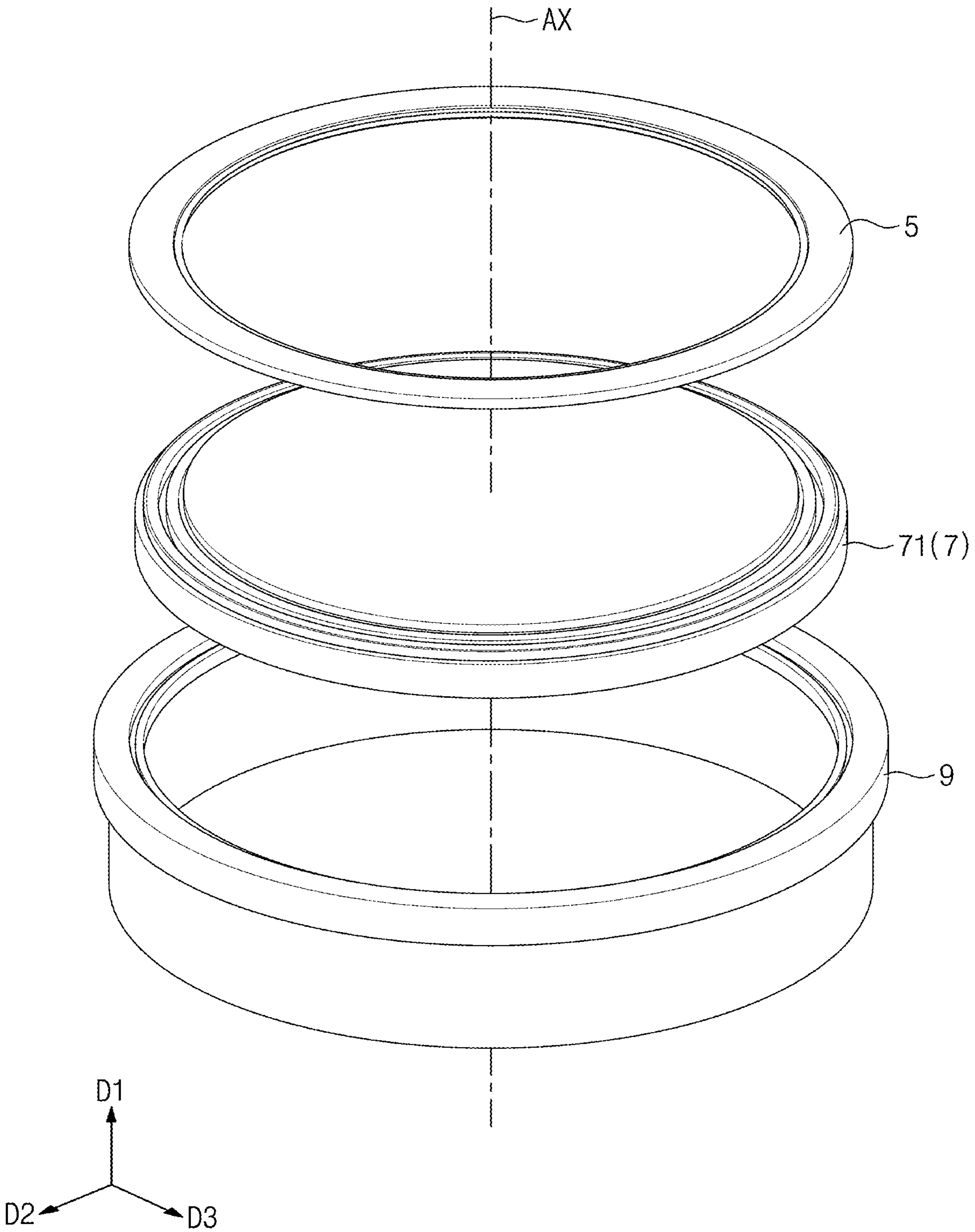
FIG. 5 illustrates a perspective view showing a stage and a focus ring according to some embodiments of the present disclosure.
Figure 6:
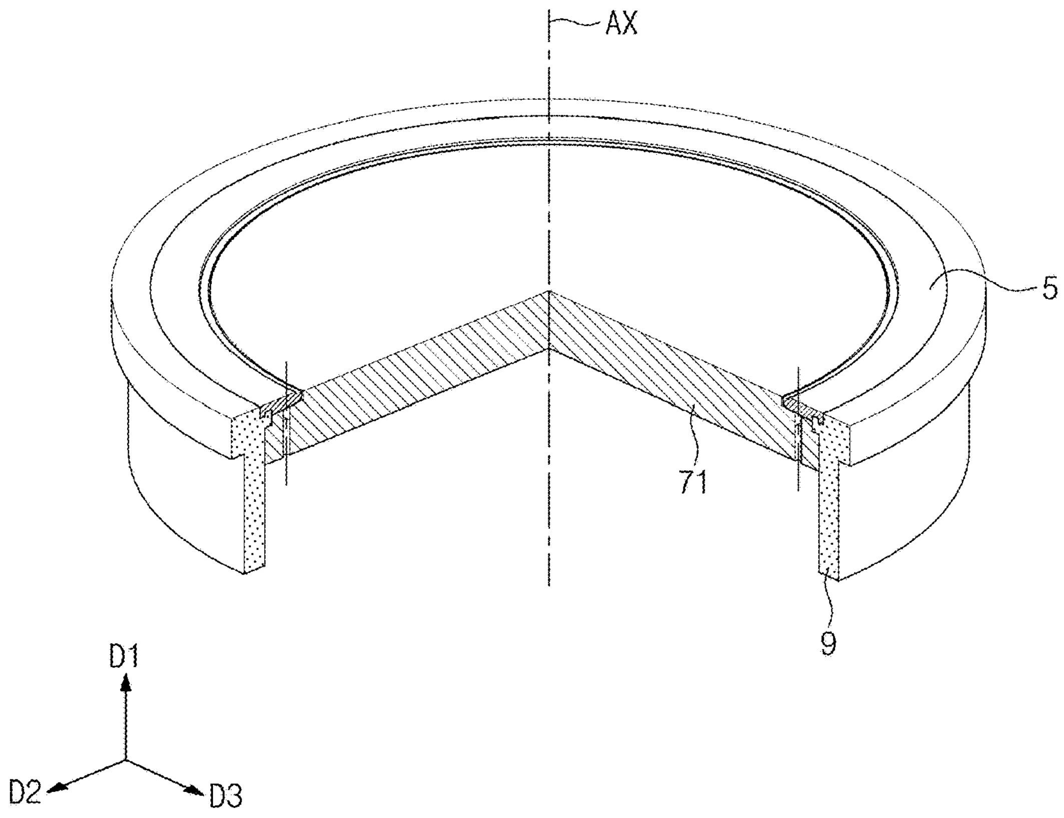
FIG. 6 illustrates a partial cut perspective view showing a stage and a focus ring according to some embodiments of the present disclosure.

FIG. 2 illustrates a cross-sectional view showing a stage and a focus ring according to some embodiments of the present disclosure. FIG. 3 illustrates an enlarged cross-sectional view showing section X of FIG. 2. FIG. 4 illustrates an exploded perspective view of FIG. 3. FIG. 5 illustrates a perspective view showing a stage and a focus ring according to some embodiments of the present disclosure. FIG. 6 illustrates a partial cut perspective view showing a stage and a focus ring according to some embodiments of the present disclosure.

Referring to FIGS. 2 to 6, the stage 7 may include a chuck body 71, a support member 72, a plasma electrode 73, a chuck electrode 75, a heater 77, and an outer chuck electrode 79.

The chuck body 71 may support a substrate and the focus ring 5. For example, a substrate and the focus ring 5 may be disposed on a top surface 71*u* of the chuck body 71. The chuck body 71 may have a cylindrical shape, but embodiments of the present disclosure are not limited thereto. The top surface 71*u* of the chuck body 71 may have a support top surface 711*u* and an edge top surface 713*u*. The support top surface 711*u* may be located at a level higher than a level of the edge top surface 713*u*. The support top surface 711*u* may have a circular shape. A substrate may be disposed on the support top surface 711*u*. For example, the support top surface 711*u* may support a substrate. The edge top surface 713*u* may surround the support top surface 711*u*. The edge top surface 713*u* may have a ring shape. The focus ring 5 may be positioned on the edge top surface 713*u*. For example, the edge top surface 713*u* may support the focus ring 5. The edge top surface 713*u* will be further discussed in detail below.

The support member 72 may support the chuck body 71. The support member 72 may have a cylindrical shape, but embodiments of the present disclosure are not limited thereto.

The plasma electrode 73 may be positioned in the chuck body 71. A radio-frequency (RF) power may be applied to the plasma electrode 73 to control the plasma in the process space 1*h* (see FIG. 1). The plasma electrode 73 may have a disk shape, but embodiments of the present disclosure are not limited thereto.

The chuck electrode 75 may be positioned in the chuck body 71. The chuck electrode 75 may be electrically connected to the first chucking power apply device 21. The first chucking power apply device 21 may apply a direct-current (DC) power to the chuck electrode 75. Thus, a substrate may be fixed onto the stage 7. The chuck electrode 75 may have a disk shape, but embodiments of the present disclosure are not limited thereto.

The heater 77 may be positioned in the chuck body 71. The heater 77 may include a plurality of coaxially arranged coils.

The outer chuck electrode 79 may be positioned in the chuck body 71. The outer chuck electrode 79 may be positioned outside the chuck electrode 75. For example, when viewed in a plan view, the outer chuck electrode 79 may surround the chuck electrode 75. The outer chuck electrode 79 may have a ring shape, but embodiments of the present disclosure are not limited thereto. The outer chuck electrode 79 may include, for example, $Al_2O_3$. The outer chuck electrode 79 may be positioned beneath the focus ring 5. The outer chuck electrode 79 may have a diameter greater than a diameter of the edge top surface 713*u*. A detailed description thereof will be further provided below.

The chuck body 71 may provide a cooling channel 71*ch* and a gas supply channel. The cooling channel 71*ch* may be provided within the chuck body 71. The cooling channel 71*ch* may not be connected to the top surface 71*u* of the chuck body 71. For example, the cooling channel 71*ch* may not be exposed on the top surface 71*u* of the chuck body 71. A cooling fluid may flow in the cooling channel 71*ch*. Thus, a temperature of the chuck body 71 may be controlled. The gas supply channel may be downwardly recessed from the top surface 71*u* of the chuck body 71. The gas supply channel may be connected to the heat transfer gas supply device 6 (see FIG. 1). The heat transfer gas supply device 6 may supply a gas through the gas supply channel to the top surface of the stage 7. Thus, heat transfer may be generated between the stage 7 and a substrate on the stage 7. In addition, heat transfer may be generated between the stage 7 and the focus ring 5 on the stage 7. The gas supply channel may include an outer channel 71*gh*. The outer channel 71*gh* may be positioned beneath the focus ring 5. The outer channel 71*gh* may be connected to the top surface 71*u* of the stage 7. The outer channel 71*gh* may be connected to the edge top surface 713*u*. For example, the outer channel 71*gh* may be exposed on the edge top surface 713*u*. A detailed description thereof will be further provided below.

Figure 7:
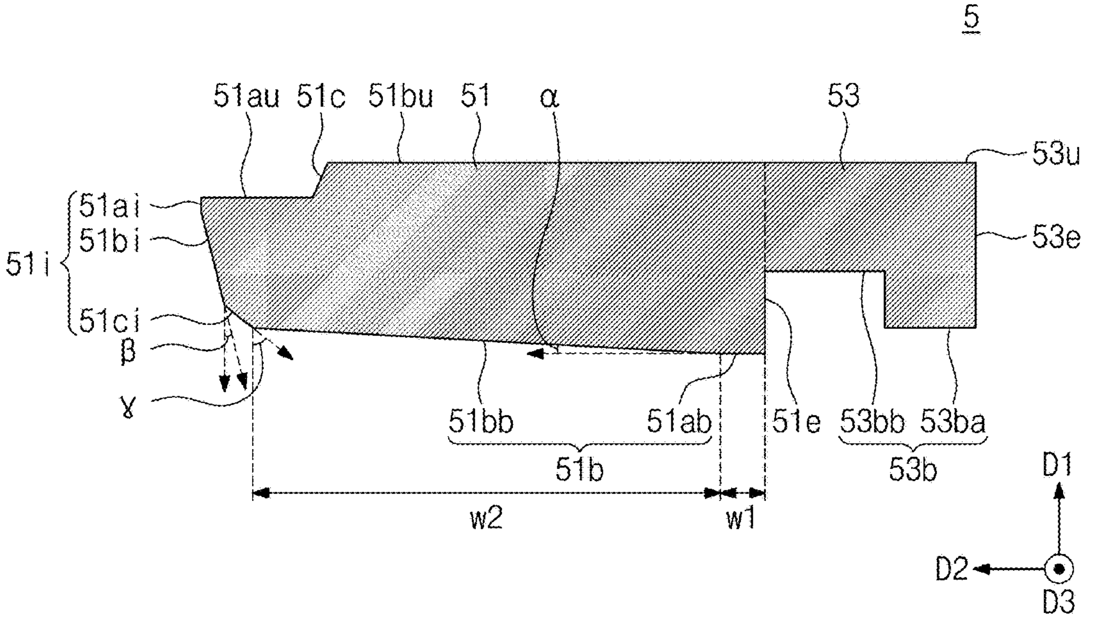
FIG. 7 illustrates a cross-sectional view showing a focus ring according to some embodiments of the present disclosure.

FIG. 7 illustrates a cross-sectional view showing a focus ring according to some embodiments of the present disclosure.

Referring to FIG. 7, the focus ring 5 may include a ring body 51 and an outer member 53.

The ring body 51 may have an axis AX (refer to FIGS. 5-6) that extends in the first direction D1. The ring body 51 may include silicon carbide (SiC), but embodiments of the present disclosure are not limited thereto. For example, the ring body 51 may include silicon (Si) and/or quartz. The ring body 51 may have a top surface, an inner lateral surface 51*i*, a bottom surface 51*b*, and an outer lateral surface 51*e*.

The top surface of the ring body 51 may include a first top surface 51*au*, a second top surface 51*bu*, and a connection top surface 51*c*. The first top surface 51*au* may be perpendicular to the first direction D1. The first top surface 51*au* may have a ring shape. The second top surface 51*bu* may be positioned outside the first top surface 51*au*. The second top surface 51*bu* may be located at a level higher than a level of the first top surface 51*au*. The connection top surface 51*c* may connect the first top surface 51*au* to the second top surface 51*bu*. The connection top surface 51*c* may form an acute angle with the first direction D1, but embodiments of the present disclosure are not limited thereto. For example, the connection top surface 51*c* may be parallel to the first direction D1.

The inner lateral surface 51*i* of the ring body 51 may downwardly extend from the top surface of the ring body 51. The ring body 51 may have a first inner lateral surface 51*ai*, a second inner lateral surface 51*bi*, and a third inner lateral surface 51*ci*.

The first inner lateral surface 51*ai* may be connected to an inner end of the first top surface 51*au*. The first inner lateral surface 51*ai* may downwardly extend from the first top surface 51*au*. The first inner lateral surface 51*ai* may be parallel to the first direction D1. For example, the first inner lateral surface 51*ai* may downwardly extend parallel to the first direction D1 from the first top surface 51*au*.

The second inner lateral surface 51*bi* may be connected to a lower end of the first inner lateral surface 51*ai*. The second inner lateral surface 51*bi* may downwardly extend from the lower end of the first inner lateral surface 51*ai*. The second inner lateral surface 51*bi* may form an acute angle ß with the first direction D1. For example, the second inner lateral surface 51*bi* may downwardly extend from the lower end of the first inner lateral surface 51*ai*, while making the acute angle ß with the first direction D1. A first acute angle may refer to the acute angle ß made between the second inner lateral surface 51*bi* and the first direction D1. The first acute angle ß may range from about 0.01° to about 5.00°, but embodiments of the present disclosure are not limited thereto.

The third inner lateral surface 51*ci* may be connected to a lower end of the second inner lateral surface 51*bi*. The third inner lateral surface 51*ci* may extend from the second inner lateral surface 51*bi* toward the bottom surface 51*b* of the ring body 51. For example, the third inner lateral surface 51*ci* may connect the second inner lateral surface 51*bi* to the bottom surface 51*b* of the ring body 51. The third inner lateral surface 51*ci* may form an acute angle $\gamma$ with the first direction D1. A third acute angle $\gamma$ may refer to the acute angle $\gamma$ made between the third inner lateral surface 51*ci* and the first direction D1. The third acute angle $\gamma$ may be greater than the first acute angle ß.

The bottom surface 51*b* of the ring body 51 may outwardly extend from a lower end of the inner lateral surface 51*i* of the ring body 51. The bottom surface 51*b* of the ring body 51 may include a flat surface 51*ab* and an inclined surface 51*bb*.

The flat surface 51*ab* may be perpendicular to the first direction D1. For example, the flat surface 51*ab* may be parallel to the horizontal direction. The flat surface 51*ab* may have a width w1 less than a width of the inclined surface 51*bb*. For example, a width w2 in a radius direction of the inclined surface 51*bb* may be greater than a width w1 in a radius direction of the flat surface 51*ab*. The width w1 in a radius direction of the flat surface 51*ab* may range, for example, from about 1.0 mm to about 8.0 mm. For example, the width w1 in a radius direction of the flat surface 51*ab* may be about 3.7 mm, but embodiments of the present disclosure are not limited thereto.

The inclined surface 51*bb* may extend from the flat surface 51*ab* toward the inner lateral surface 51*i* of the ring body 51. The inclined surface 51*bb* may form an acute angle $\alpha$ with the flat surface 51*ab*. For example, the inclined surface 51*bb* may form an acute angle $90°-\alpha$ with the first direction D1. A second acute angle may refer to the acute angle $90°-\alpha$ made between the inclined surface 51*bb* and the first direction D1. The second acute angle $90°-\alpha$ may be greater than each of the first acute angle ß and the second acute angle $\gamma$. The second acute angle $90°-\alpha$ may range, for example, from about 88.00° to about 89.95°. For example, the acute angle $\alpha$ made between the inclined surface 51*bb* and the flat surface 51*ab* may range from about 0.05° to about 2.00°.

In a state where the focus ring 5 is disposed on the stage 7 (see FIG. 3), the focus ring 5 may have a bottom surface 51*b* and a bottom surface 53*b* in contact with the top surface 71*u* of the chuck body 71. For example, the focus ring 5 and the stage 7 may be in direct contact with each other without any adhesive or pad between the focus ring 5 and the stage 7.

The outer lateral surface 51*e* of the ring body 51 may outwardly extend from an edge of the bottom surface 51*b* of the ring body 51. The outer lateral surface 51*e* of the ring body 51 may be parallel to the first direction D1, but embodiments of the present disclosure are not limited thereto.

The outer member 53 may be connected to an outer side of the ring body 51. The outer member 53 and the ring body 51 may be integrally formed in to a single unitary piece. For example, when the ring body 51 includes silicon carbide (SiC), the outer member 53 may also include silicon carbide (SiC). The outer member 53 may have a bottom surface 53*b*, a top surface 53*u*, and an outer lateral surface 53*e*.

The bottom surface 53*b* of the outer member 53 may include a first bottom surface 53*ba* and a second bottom surface 53*bb*. The first bottom surface 53*ba* may be located at a level higher than a level of the second bottom surface 53*bb*. The second bottom surface 53*bb* may be positioned inwards from the first bottom surface 53*ba*. The second bottom surface 53*bb* may be in contact with the outer lateral surface 51*e* of the ring body 51. The second bottom surface 53*bb* and the first bottom surface 53*ba* may be located at levels each of which is higher than a level of the flat surface 51*ab*.

The top surface 53*u* of the outer member 53 may be perpendicular to the first direction D1. The top surface 53*u* of the outer member 53 may be connected to the top surface (e.g., the second top surface 51*bu*) of the ring body 51. The top surface 53*u* of the outer member 53 may be located at a level substantially the same as or similar to a level of the second top surface 51*bu* of the ring body 51.

The outer lateral surface 53*e* of the outer member 53 may connect the bottom surface 53*b* of the outer member 53 to the top surface 53*u* of the outer member 53. The outer lateral surface 53*e* of the outer member 53 may be parallel to the first direction D1, but embodiments of the present disclosure are not limited thereto.

Figure 8:
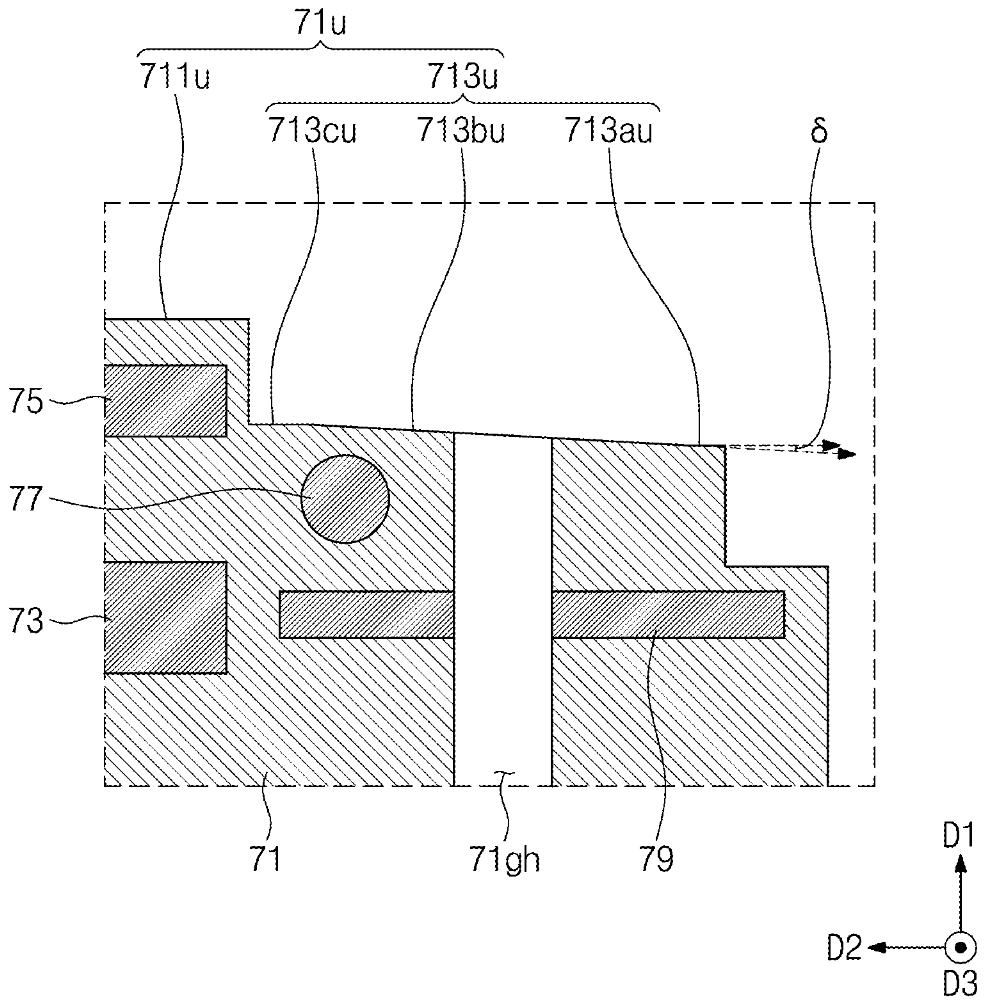
FIG. 8 illustrates a cross-sectional view showing a stage according to some embodiments of the present disclosure.
Figure 9:
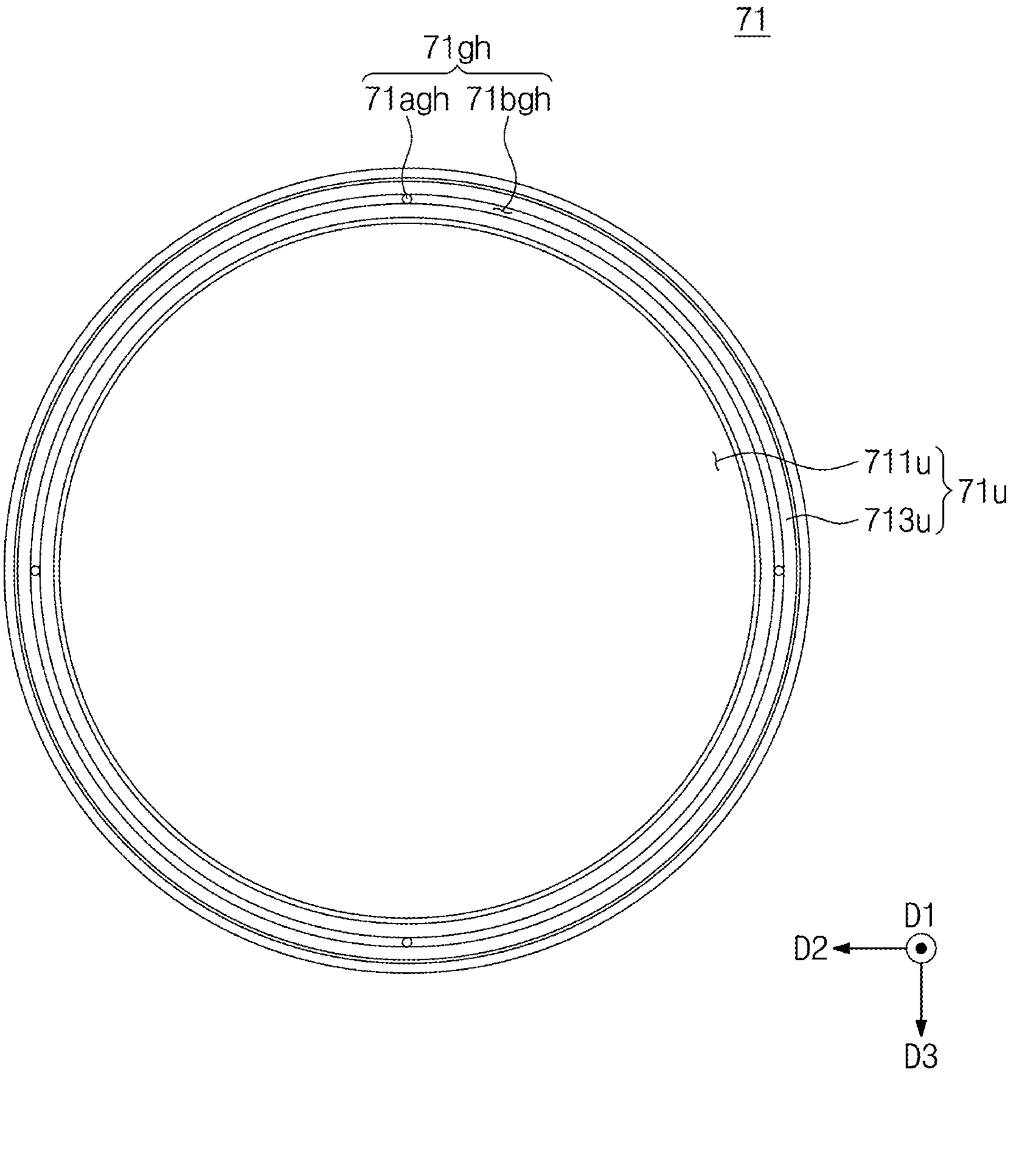
FIG. 9 illustrates a plan view showing a stage according to some embodiments of the present disclosure.

FIG. 8 illustrates a cross-sectional view showing a stage according to some embodiments of the present disclosure. FIG. 9 illustrates a plan view showing a stage according to some embodiments of the present disclosure.

Referring to FIG. 8, the edge top surface 713*u* of the stage 7 may include a flat top surface 713*au*, an inclined top surface 713*bu*, and an extended top surface 713*cu*.

The flat top surface 713*au* may be perpendicular to the first direction D1. For example, the flat top surface 713*au* may be parallel to the flat surface 51*ab* (see FIG. 7). The flat surface 51*ab* may be supported on the flat top surface 713*au*. For example, the flat surface 51*ab* may be in contact with the flat top surface 713*au*. A width in a radius direction of the flat top surface 713*au* may be substantially the same as or similar to a width in a radius direction of the flat surface 51*ab*, but embodiments of the present disclosure are not limited thereto. The flat surface 51*ab* may have an outer diameter less than an outer diameter of the outer chuck electrode 79. Thus, when a direct-current (DC) voltage is applied to the outer chuck electrode 79, an entirety of the flat surface 51*ab* of the focus ring 5 may be in uniform contact with an entirety of the flat top surface 713*au*.

The inclined top surface 713*bu* may be positioned inwards from the flat top surface 713*au*. The inclined top surface 713*bu* may extend from the flat top surface 713*au* toward the support top surface 711*u*. The inclined top surface 713*bu* may form an acute angle $\delta$ with the flat top surface 713*au*. A fourth acute angle may refer to the acute angle $\delta$ between the inclined top surface 713*bu* and the flat top surface 713*au*. The fourth acute angle $\delta$ may be substantially the same as or similar to the second acute angle (see $90°-\alpha$ of FIG. 7). The inclined top surface 713*bu* may be parallel to the inclined surface 51*bb* (see FIG. 7). The inclined surface 51*bb* may be supported on the inclined top surface 713*bu*. The inclined surface 51*bb* may be in contact with the inclined top surface 713*bu*.

The extended top surface 713*cu* may be positioned inwards from the inclined top surface 713*bu*. The extended top surface 713*cu* may be perpendicular to the first direction D1, but embodiments of the present disclosure are not limited thereto.

Referring to FIGS. 8 and 9, the outer channel 71*gh* may include a distribution channel 71*bgh* and a connection channel 71*agh*.

The distribution channel 71*bgh* may extend in a circumferential direction. For example, the distribution channel 71*bgh* may have an annular shape. The distribution channel 71*bgh* may be connected to the top surface 71*u* of the chuck body 71. For example, the distribution channel 71*bgh* may be connected to the inclined top surface 713*bu*. An upper end of the outer channel 71*gh* may be positioned beneath the inclined surface 51*bb*.

The connection channel 71*agh* may downwardly extend from the distribution channel 71*bgh*. The distribution channel 71*bgh* may be provided in plural. The plurality of the distribution channel 71*bgh* may arranged spaced apart from each other in a circumferential direction. A single distribution channel 71*bgh* will be discussed below in the interest of convenience. The distribution channel 71*bgh* may be connected to the heat transfer gas supply device 6 (see FIG. 1). A gas supplied from the heat transfer gas supply device 6 may reach the connection channel 71*agh* via the distribution channel 71*bgh*. A gas supplied from the heat transfer gas supply device 6 may diffuse in a circumferential direction along the connection channel 71*agh* and then may ascend toward a bottom surface of the focus ring 5 (see FIG. 7).

Figure 10:
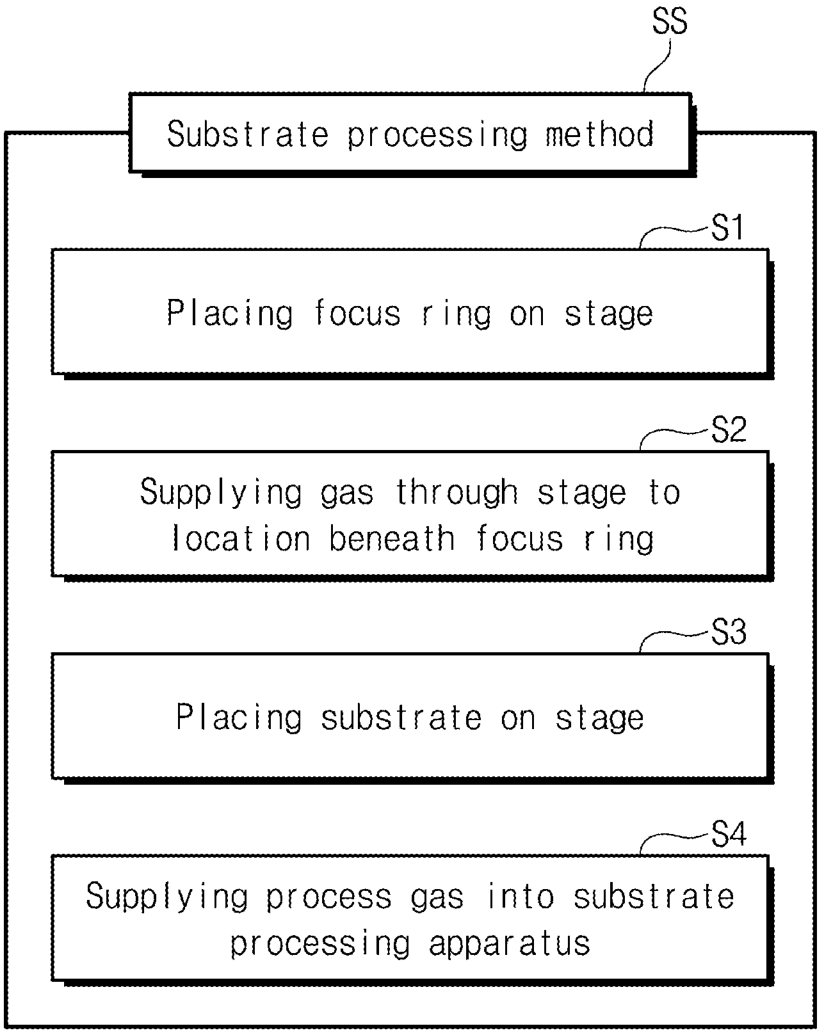
FIG. 10 illustrates a flow chart showing a substrate processing method according to some embodiments of the present disclosure.

FIG. 10 illustrates a flow chart showing a substrate processing method according to some embodiments of the present disclosure.

Referring to FIG. 10, a substrate processing method SS may be provided. The substrate processing method SS may be a way of processing a substrate by using the substrate processing apparatus SA discussed with reference to FIGS. 1 to 9. The substrate processing method SS may include placing a focus ring on a stage (operation S1), supply a gas through the stage to a location beneath the focus ring (operation S2), placing a substrate on the stage (operation S3), and supply a process gas into a substrate processing apparatus (operation S4).

The substrate processing method SS of FIG. 10 will be discussed in detail below with reference to FIGS. 11 to 16.

FIGS. 11 to 16 illustrate diagrams showing a substrate processing method according to the flow chart of FIG. 10.

Figure 11:
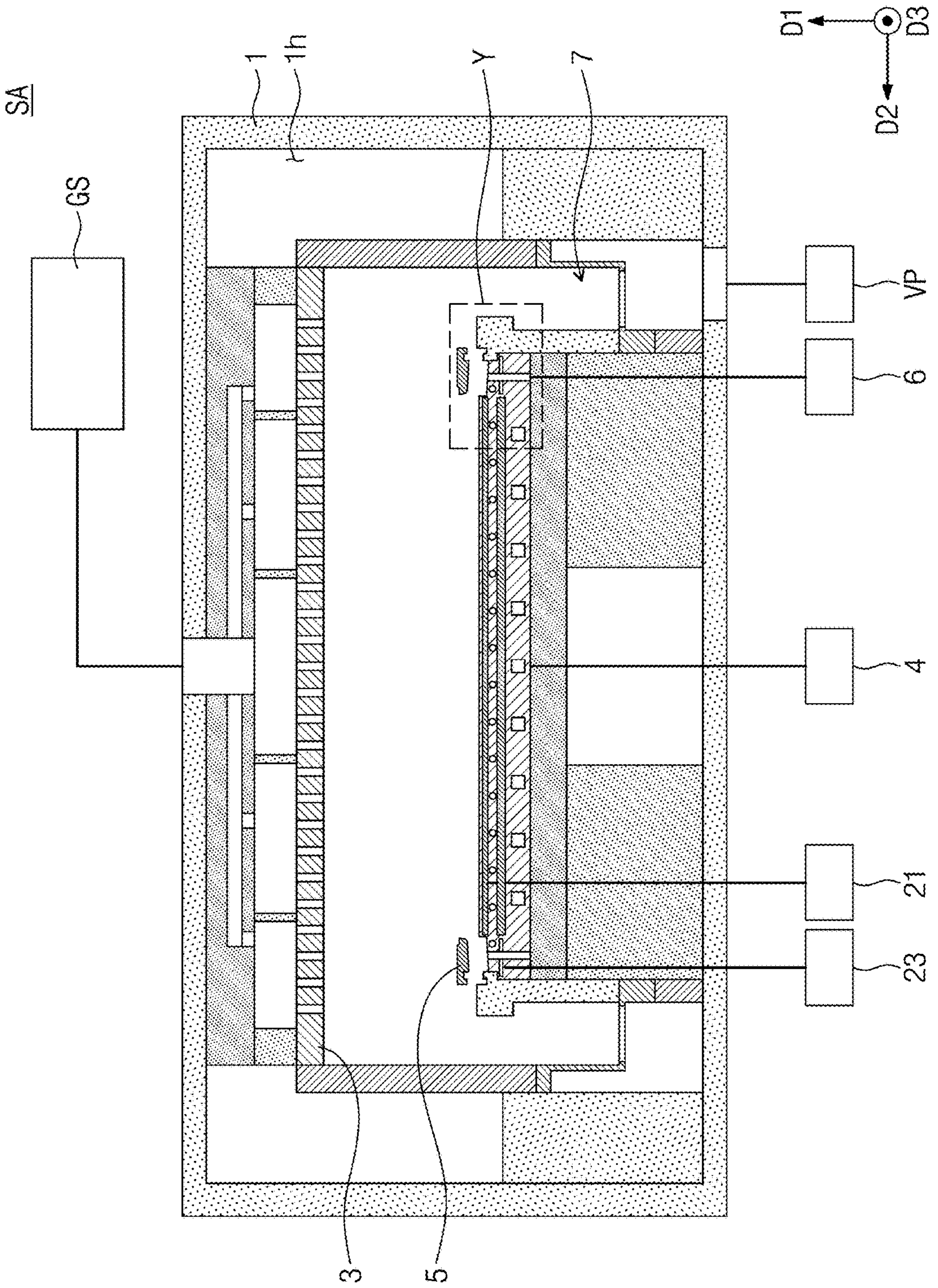
FIGS. 11 to 16 illustrate diagrams showing a substrate processing method according to the flow chart of FIG. 10.
Figure 12:
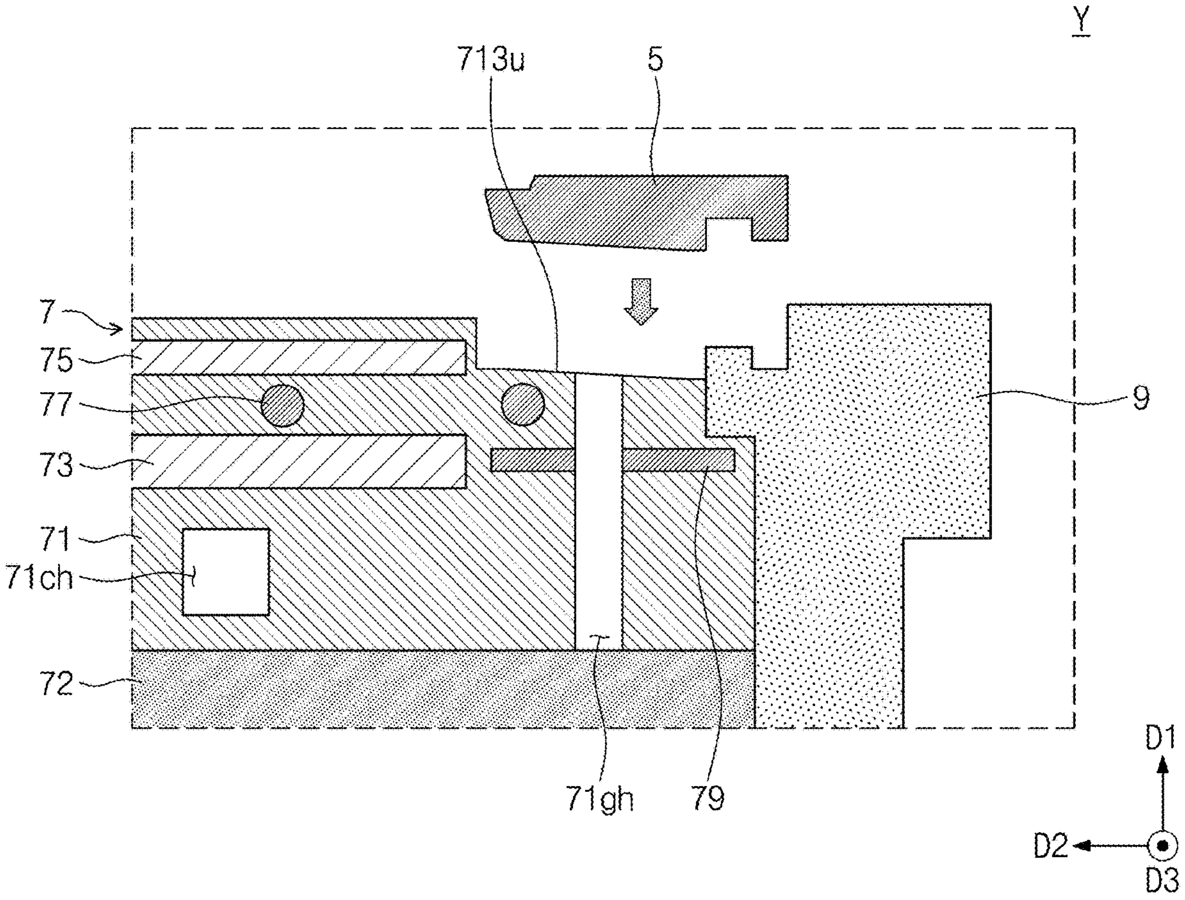

Referring to FIGS. 10, 11, and 12, the operation S1 may include placing the focus ring 5 on the edge top surface 713*u*. After the focus ring 5 is disposed on the edge top surface 713*u*, a chucking power DP applied from the second chucking power apply device 23 (see FIG. 13) to the outer chuck electrode 79 may rigidly place the focus ring 5 on the stage 7.

Figure 13:
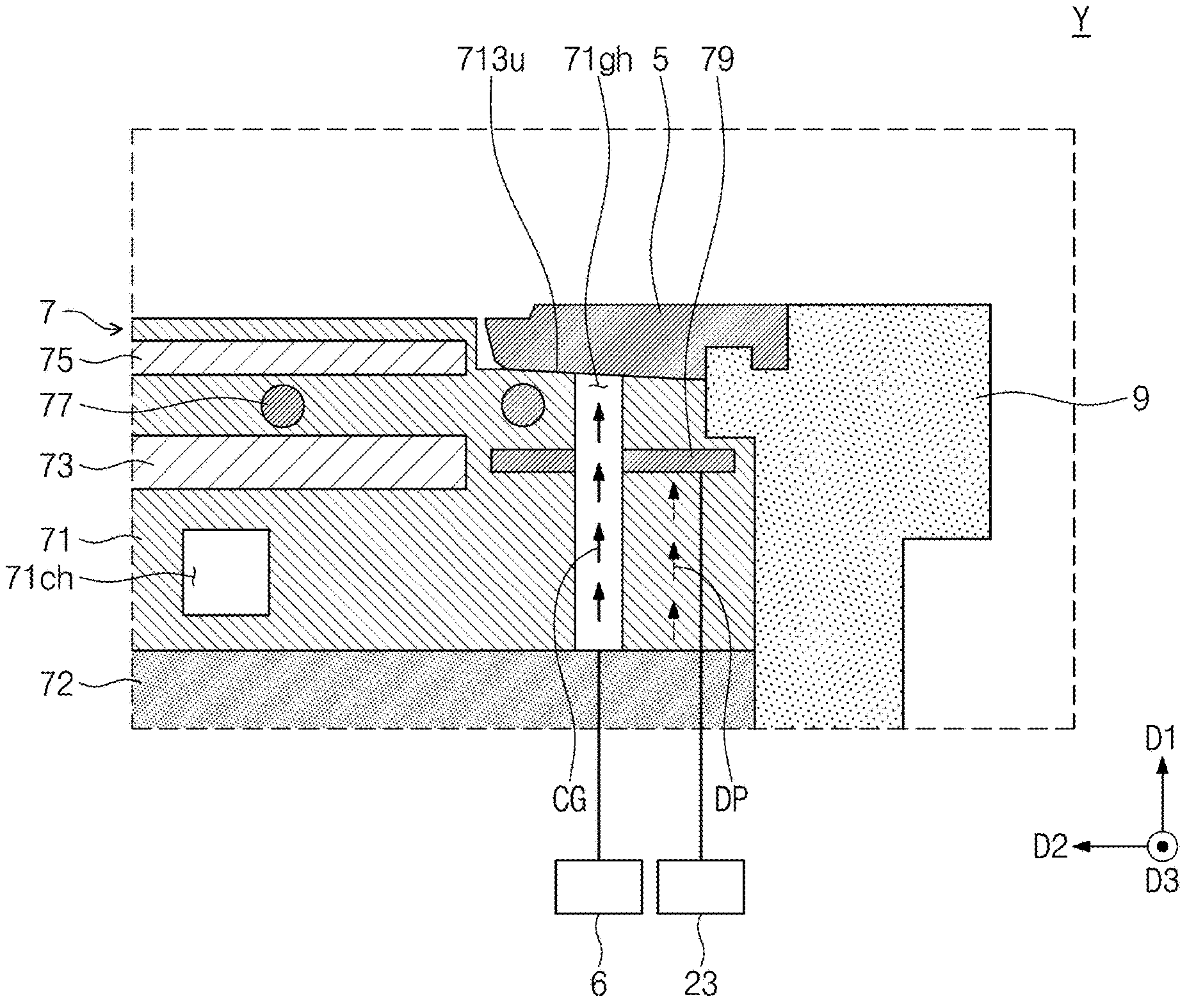

Referring to FIGS. 10 and 13, the operation S2 may include allowing the heat transfer gas supply device 6 to supply a gas CG. The gas CG supplied from the heat transfer gas supply device 6 may be a heat transfer gas. The gas CG supplied from the heat transfer gas supply device 6 may include helium (He), but embodiments of the present disclosure are not limited thereto. The gas CG supplied from the heat transfer gas supply device 6 may reach a bottom surface of the focus ring 5 via the outer channel 71*gh*. For example, the gas CG ascending in the outer channel 71*gh* may reach the inclined surface 51*bb* (see FIG. 7). The gas CG reaching the inclined surface 51*bb* may spread along a gap between the inclined surface 51*bb* and the inclined top surface 713*bu* (see FIG. 8). Therefore, the gas CG may be uniformly discharged.

Figure 14:
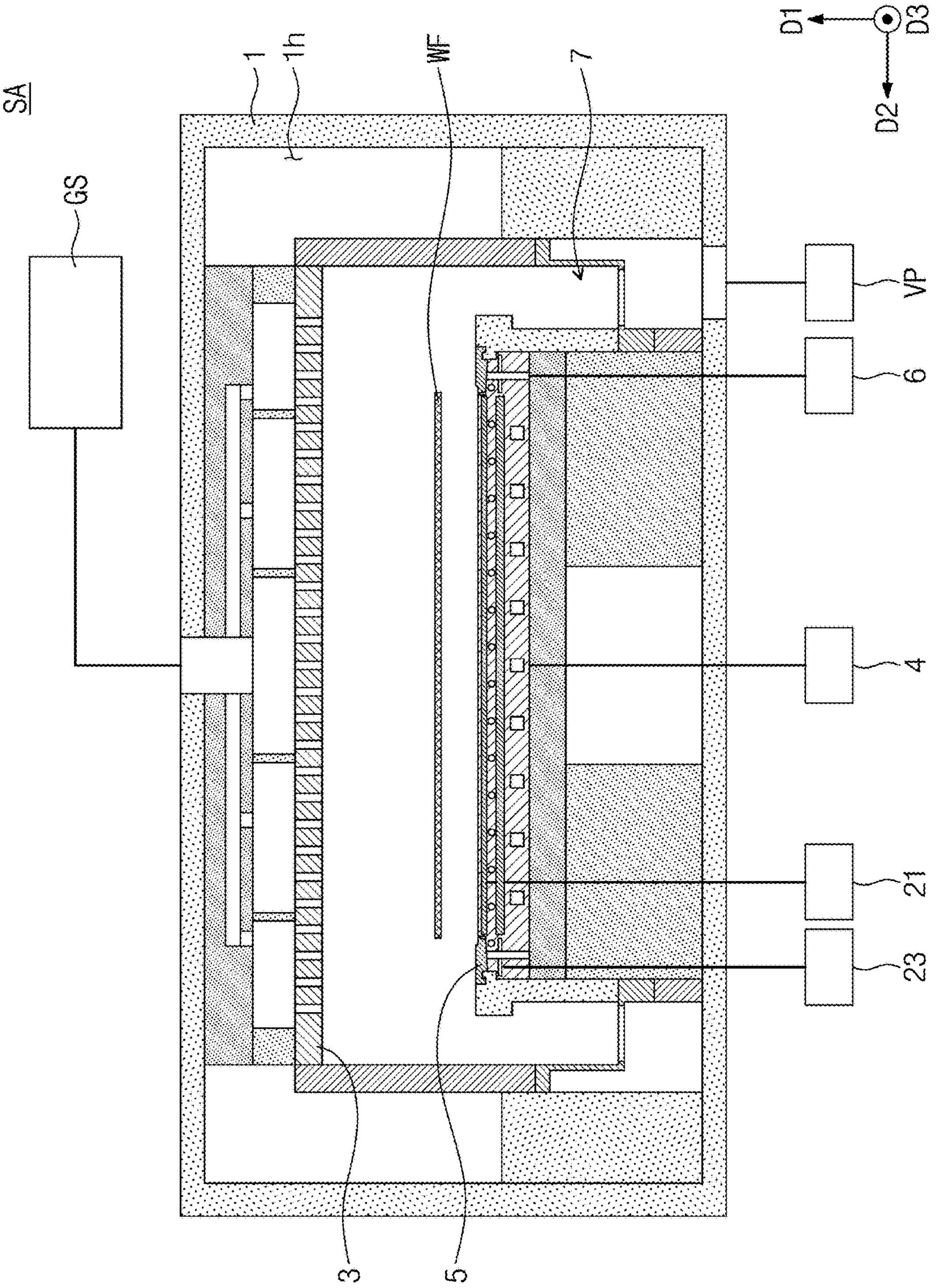

Referring to FIGS. 10 and 14, the operation S3 may include placing a substrate WF on the support top surface 711*u* (see FIG. 8). After the substrate WF is disposed on the stage 7, a direct-current (DC) power applied from the first chucking power apply device 21 may compel the substrate WF to fix on a certain position on the stage 7.

Figure 15:
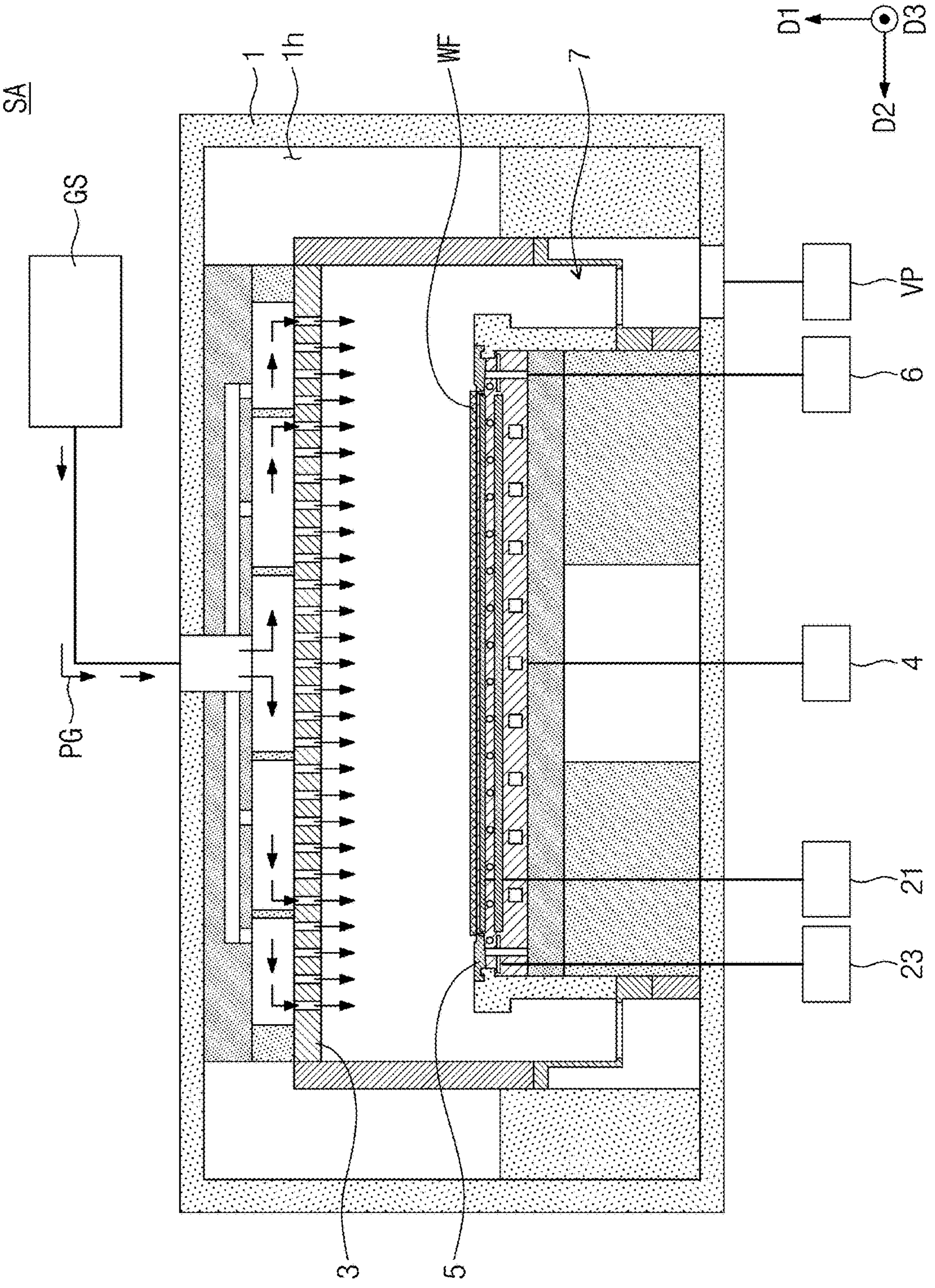

Referring to FIGS. 10 and 15, the operation S4 may include allowing the gas supply device GS to supply a process gas PG into the process space 1*h*. The process gas PG may include one or more from among an argon (Ar) gas, an oxygen ($O_2$) gas, and a chlorine (Cl) gas, but embodiments of the present disclosure are not limited thereto. The process gas PG may be uniformly distributed through the showerhead 3 to the substrate WF.

Figure 16:
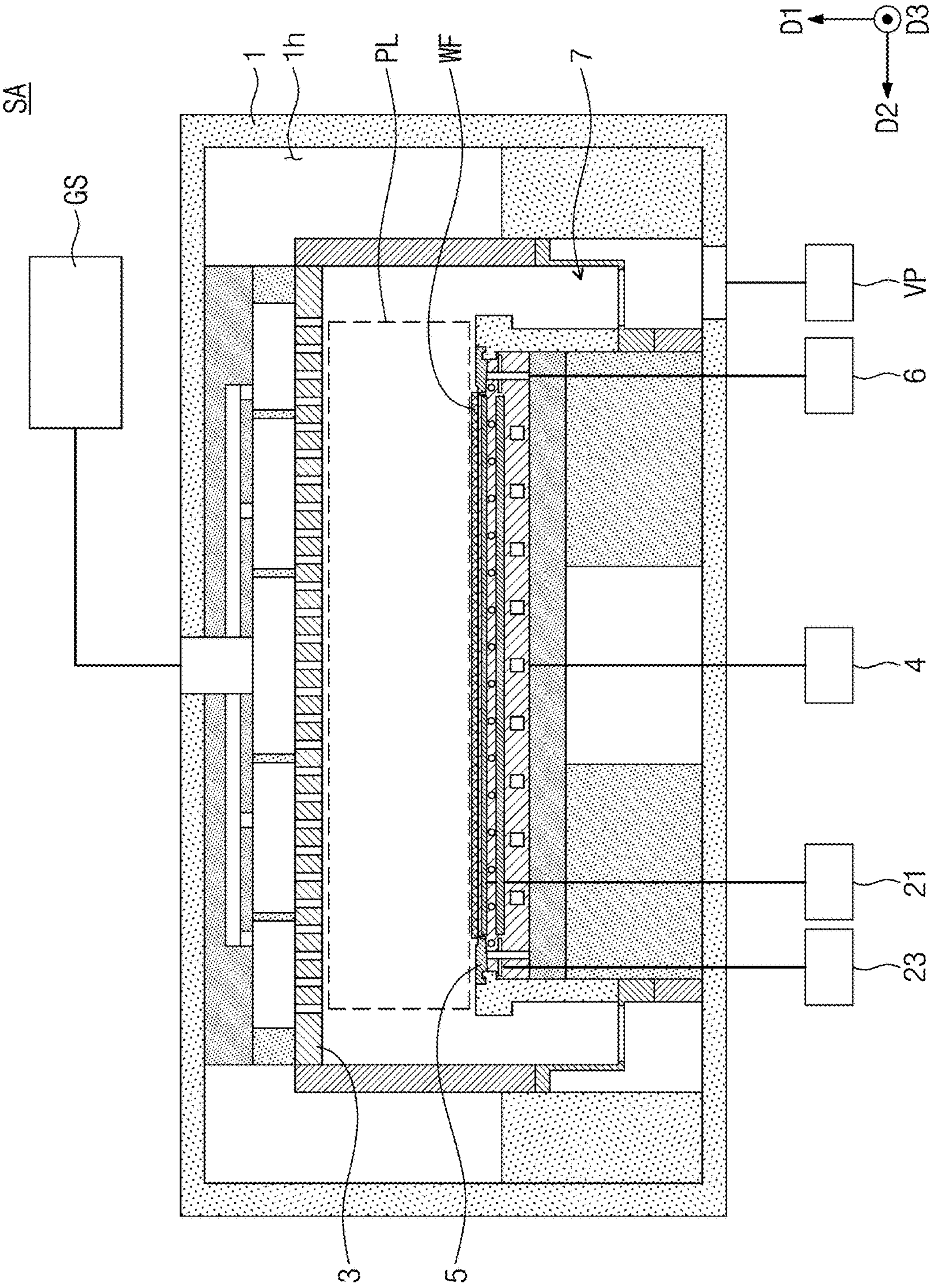

Referring to FIG. 16, a radio-frequency (RF) power applied from the radio-frequency (RF) power apply device 4 may cause a portion of the process gas PG (see FIG. 15) in the process space 1*h* to be converted into a plasma PL. The plasma PL may process the substrate WF on the stage 7. For example, the plasma PL may etch the substrate WF on the stage 7.

According to a focus ring, a substrate processing apparatus including the same, and a substrate processing method using the same in accordance with some embodiments of the present disclosure, a stage and a focus ring may have their top surfaces whose shapes are coincident with each other to allow the focus ring to accurately and promptly reside on the stage. For example, an inclined top surface of the stage and a flat top surface that are respectively coincident with an inclined surface of the focus ring and a flat surface may cause the focus ring to accurately lie on the stage.

According to a focus ring, a substrate processing apparatus including the same, and a substrate processing method using the same in accordance with some embodiments of the present disclosure, an inner lateral surface of the focus ring may be partially inclined, such that a focus ring may be automatically positioned when the focus ring is disposed on a stage. Therefore, even a less-skilled worker may easily dispose the focus ring. In addition, as the inner lateral surface of the focus ring has an upper portion that is not inclined, an inner edge of the focus ring may be prevented from being etched with plasma during fabrication process. Accordingly, the focus ring may be used for a long time.

According to a focus ring, a substrate processing apparatus including the same, and a substrate processing method using the same in accordance with some embodiments of the present disclosure, a gas supplied from a cooling gas supply device may be uniformly and constantly discharged through between an inclined surface of a focus ring and an inclined top surface of a stage. Therefore, the gas discharge may be appropriately controlled to increase a process yield.

According to a focus ring, a substrate processing apparatus including the same, and a substrate processing method using the same of embodiments of the present disclosure, it may be possible to uniformly control discharge of heat transfer gas.

According to a focus ring, a substrate processing apparatus including the same, and a substrate processing method using the same of embodiments of the present disclosure, it may be possible to increase a yield of an etching process.

According to a focus ring, a substrate processing apparatus including the same, and a substrate processing method using the same of embodiments of the present disclosure, a prompt installation may be accurately performed.

Effects of embodiments of the present disclosure are not limited to the mentioned above, other effects which have not been mentioned above will be clearly understood to those skilled in the art from the above description.

Although non-limiting example embodiments have been described in connection with the drawings, it will be understood to those skilled in the art that various changes and modifications may be made without departing from the technical spirit and scope of the present disclosure. It therefore will be understood that the embodiments described above are just illustrative and are not limitative in all aspects.

What is claimed is:

1. A substrate processing apparatus, comprising:

a focus ring comprising a ring body having an axis that extends in a first direction, wherein the ring body comprises:

a top surface;

an inner lateral surface that downwardly extends from the top surface; and a bottom surface that outwardly extends from a lower end of the inner lateral surface, wherein the inner lateral surface comprises:

a first inner lateral surface that downwardly extends from the top surface, the first inner lateral surface being parallel to the first direction; and a second inner lateral surface that downwardly extends from a lower end of the first inner lateral surface, the second inner lateral surface making a first acute angle with the first direction, and wherein the bottom surface comprises:

a flat surface perpendicular to the first direction; and an inclined surface that extends from the flat surface toward the second inner lateral surface, the inclined surface making a second acute angle with the first direction.

2. The substrate processing apparatus of claim 1, wherein the second acute angle is greater than the first acute angle.

3. The substrate processing apparatus of claim 2, wherein the second acute angle is in a range of 88.00° to 89.95°.

4. The substrate processing apparatus of claim 1, wherein the inner lateral surface further comprises a third inner lateral surface that extends from a lower end of the second inner lateral surface toward the inclined surface and connects the second inner lateral surface to the inclined surface, wherein the third inner lateral surface forms a third acute angle with the first direction, wherein the third acute angle is greater than the first acute angle and less than the second acute angle.

5. The substrate processing apparatus of claim 1, wherein the ring body comprises silicon carbide (SiC).

6. The substrate processing apparatus of claim 1, wherein a width of the flat surface in a radius direction of the focus ring is less than a width of the inclined surface in the radius direction.

7. The substrate processing apparatus of claim 1, wherein the focus ring further comprising an outer member connected to an outer side of the ring body, wherein the outer member comprises:

a first bottom surface; and a second bottom surface inwards from the first bottom surface, wherein the second bottom surface is in contact with an outer lateral surface of the ring body, wherein the second bottom surface is at a level higher than a level of each of the first bottom surface and the flat surface, wherein the level of the first bottom surface is higher than the level of the flat surface.

8. A substrate processing apparatus, comprising:

a process chamber that includes a process space;

a stage in the process chamber; and a focus ring on the stage, wherein the stage comprises:

a chuck body; and a chuck electrode in the chuck body, wherein the chuck body includes a gas supply channel that is downwardly recessed from a top surface of the chuck body, wherein the gas supply channel includes an outer channel beneath the focus ring, wherein the focus ring comprises a ring body, wherein the ring body comprises:

a top surface;

an inner lateral surface that downwardly extends from the top surface of the ring body; and a bottom surface that outwardly extends from a lower end of the inner lateral surface, wherein the bottom surface comprises:

a flat surface parallel to a horizontal direction of the focus ring; and an inclined surface that extends from the flat surface toward the inner lateral surface and forms a first acute angle with the flat surface.

9. The substrate processing apparatus of claim 8, wherein an upper end of the outer channel is beneath the inclined surface.

10. The substrate processing apparatus of claim 8, wherein the top surface of the chuck body comprises:

a support top surface that is configured to support a substrate; and an edge top surface having a ring shape that surrounds the support top surface, wherein the support top surface is at a level higher than a level of the edge top surface, and wherein the focus ring is on the edge top surface.

11. The substrate processing apparatus of claim 10, wherein the edge top surface comprises:

a flat top surface parallel to the flat surface; and an inclined top surface that extends from the flat top surface toward the support top surface and forms a second acute angle with the flat top surface, wherein the outer channel is connected to the inclined top surface.

12. The substrate processing apparatus of claim 11, wherein the inclined top surface is parallel to the inclined surface.

13. The substrate processing apparatus of claim 10, wherein a bottom surface of the focus ring is in contact with the edge top surface.

14. The substrate processing apparatus of claim 13, wherein the stage further comprises an outer chuck electrode in the chuck body and outside of the chuck electrode, wherein the outer chuck electrode is beneath the focus ring.

15. The substrate processing apparatus of claim 14, wherein the outer chuck electrode comprises a ring shape, and an outer diameter of the outer chuck electrode is greater than an outer diameter of the flat surface.

16. The substrate processing apparatus of claim 8, wherein the outer channel includes:

a distribution channel that extends in a circumferential direction of the chuck body and is connected to the top surface of the chuck body; and a plurality of connection channels that downwardly extend from the distribution channel, wherein the plurality of connection channels are spaced apart from each other in the circumferential direction.

17. The substrate processing apparatus of claim 1, further comprising:

a process chamber that includes a process space; and a stage in the process chamber, wherein the focus ring in on the stage.

18. The substrate processing apparatus of claim 17, wherein the stage comprises:

a chuck body; and a chuck electrode in the chuck body, wherein the chuck body includes a gas supply channel that is downwardly recessed from a top surface of the chuck body, and wherein the gas supply channel includes an outer channel beneath the focus ring.

19. The substrate processing apparatus of claim 18, wherein the top surface of the chuck body comprises:

a support top surface that is configured to support a substrate; and an edge top surface having a ring shape that surrounds the support top surface, wherein the support top surface is at a level higher than a level of the edge top surface, and wherein the focus ring is on the edge top surface.

20. The substrate processing apparatus of claim 19, wherein a bottom surface of the focus ring is in contact with the edge top surface.

* * * * *